(12) United States Patent
Chen et al.

(10) Patent No.: US 7,209,392 B2
(45) Date of Patent: Apr. 24, 2007

(54) SINGLE POLY NON-VOLATILE MEMORY

(75) Inventors: Hsin-Ming Chen, Tainan Hsien (TW); Shih-Chen Wang, Taipei (TW); Hong-Ping Tsai, Kao-Hsiung (TW)

(73) Assignee: eMemory Technology Inc., Hsin-Chu (TW)

( * ) Notice: Subject to any disclaimer, the term of this patent is extended or adjusted under 35 U.S.C. 154(b) by 80 days.

(21) Appl. No.: 10/905,736

(22) Filed: Jan. 19, 2005

(65) Prior Publication Data

US 2006/0018161 A1    Jan. 26, 2006

Related U.S. Application Data

(60) Provisional application No. 60/521,916, filed on Jul. 20, 2004.

(51) Int. Cl.
*G11C 16/04* (2006.01)

(52) U.S. Cl. .............................. 365/185.26; 365/185.28
(58) Field of Classification Search ............ 365/185.28
See application file for complete search history.

(56) References Cited

U.S. PATENT DOCUMENTS

| | | | | |
|---|---|---|---|---|
| 4,956,564 A | * | 9/1990 | Holler et al. ........... | 365/185.03 |
| 5,294,819 A | * | 3/1994 | Simko .................... | 365/185.03 |
| 5,604,700 A | * | 2/1997 | Parris et al. ............ | 365/185.1 |
| 5,640,344 A | * | 6/1997 | Pani et al. .............. | 365/182 |
| 6,028,787 A | * | 2/2000 | Sansbury et al. ...... | 365/185.01 |
| 6,038,190 A | * | 3/2000 | Kowalski et al. ........ | 365/228 |

* cited by examiner

*Primary Examiner*—Thong Q. Le
(74) *Attorney, Agent, or Firm*—Winston Hsu (57) ABSTRACT

An erasable programmable non-volatile memory cell encompasses an ion well; a first select transistor including a select gate, source/drain formed in the ion well, and a channel region formed between its source and drain; a first floating gate transistor having a drain, a source coupled to the drain of the first select transistor, a first floating gate channel region formed between its drain and source, and a common floating gate overlying the floating gate channel region; a second select transistor including a select gate, source/drain formed in the ion well, and a channel region formed between its source and drain; and a second floating gate transistor having a drain, a source coupled to the drain of the second select transistor, a second floating gate channel region formed between its drain and source, and the common floating gate overlying the second floating gate channel region.

19 Claims, 9 Drawing Sheets

SINGLE POLY NON-VOLATILE MEMORY

CROSS REFERENCE TO RELATED APPLICATIONS

This application claims the benefit of U.S. provisional application No. 60/521,916, filed Jul. 20, 2004.

BACKGROUND OF INVENTION

1. Field of the Invention

The present invention relates to non-volatile memory devices and, more particularly, to a single-poly erasable programmable non-volatile memory cell with the characteristics of faster program speed and lower current consumption while programming the cell.

2. Description of the Prior Art

A single-poly electrically programmable read-only-memory (EPROM) cell is a non-volatile storage device which is suggested to be fabricated by process steps fully compatible with conventional single-poly CMOS fabrication process. As a result, single-poly EPROM cells are often embedded in CMOS logic and mixed-signal circuits.

Conventional single-poly EPROM cells utilize a well region as the control gate of the cell, and further utilize adjoining N+ and P+ contact regions, which are formed in the well region, as a means for biasing the well region and injecting minority carriers into the surface of the well region during programming. Typically, the single-poly EPROM cells are programmed by applying a large positive voltage to the N+ and P+ regions.

For example, U.S. Pat. No. 5,465,231 to Ohsaki teaches an EEPROM cell which can be manufactured by a standard CMOS process. The EEPROM cell has a first MOS transistor formed in a semiconductor substrate of a first conductivity type and having current conducting regions of a second conductivity type and a gate electrode, a well of a second conductivity type provided in the substrate, a plate electrode formed on the well with an insulating layer interposed therebetween, and at least one region of the first conductivity type formed in the well adjacent to the plate electrode. The gate electrode and the plate electrode are connected in common and act as a floating gate, and the well acts as a control gate.

U.S. Pat. No. 5,736,764 filed by Chang teaches a P-channel single-poly EPROM cell has P+ source and P+ drain regions, and a channel extending therebetween, formed in an N-type well. A thin layer of tunnel oxide is provided over the channel and over significant portions of P+ source and P+ drain regions. A poly-silicon floating gate overlies the tunnel oxide. A P diffusion region is formed in a portion of the N-well underlying the floating gate and is thereby capacitively coupled to the floating gate. The P diffusion region serves as a control gate for the memory cell. Programming is accomplished by coupling a sufficient voltage to the floating gate via the control gate while biasing the source and drain regions to cause the hot injection of electrons from the N-well/drain junction to the floating gate. One disadvantage of this approach is that a large coupling area (P diffusion region—floating gate) is required.

U.S. Pat. No. 5,742,542 to Lin et al. teaches an EEPROM structure which has a longer data retention period. The EEPROM structure includes a write select transistor, a read select transistor, and a floating gate sense transistor. The source of the write select transistor is capacitively coupled to the floating gate of the floating gate sense transistor via a tunnel oxide layer. The floating gate of the floating gate sense transistor is also capacitively coupled to a control gate line via a gate oxide layer. The sense transistor is formed as an enhancement transistor so as to allow the EEPROM structure to be operated in a region where the floating gate potential is positive for both programmed and erased conditions, thereby using only positive charges to store data. However, the cell structure needs a limiting tunneling window, which complicates the fabrication process of the cell.

U.S. Pat. No. 6,678,190 filed Jan. 25, 2002 entitled "Single-poly embedded EPROM", by Yang et al., which is commonly owned by the same party of the present application, teaches a 2-T (two-transistor) EPROM cell comprising two serially connected P-type metal-oxide semiconductor (PMOS) transistors formed in an N well. One of the two PMOS transistors (first transistor) acts as a select transistor. A gate of the other PMOS transistor serves as a floating gate. The select gate is coupled to a select gate voltage ($V_{SG}$). A source of the select transistor is biased to source line voltage ($V_{SL}$). A drain of the second PMOS transistor is biased to a bit line voltage ($V_{BL}$), thereby providing a negative bias on the floating gate to perform programming mode without applying a certain bias on a conventional control gate that is omitted in this case.

Although the 2-T EPROM (Neobit™) technology disclosed in the commonly owned U.S. Pat. No. 6,678,190 has several advantages in terms of, for example, cell size and CMOS process compatibility, over other prior arts, the cell performance such as programming speed is still not satisfactory yet. By way of example, the current consumption for programming a 2-T EPROM cell may be up to >100 μA for a programming time period of about $10^{-4}$ second (operation conditions: $V_{BL}=V_{SG}=V_{PP}=-6V$; $V_{SL}=V_{NW}=0V$). To meet the requirements of future portable electronic equipments, it is desired to provide an EPROM cell having lower current consumption during programming and faster programming speed as well.

SUMMARY OF INVENTION

It is the primary object of the present invention to provide an erasable programmable non-volatile memory cell structure with the characteristics of faster program speed and lower current consumption while programming the cell.

According to the claimed invention, an erasable programmable non-volatile memory cell is disclosed. The erasable programmable non-volatile memory cell includes an ion well formed on a semiconductor substrate; a first select transistor including a select gate, source/drain formed in the ion well, and a channel region formed between its source and drain, wherein a source line is electrically connected to its source; a first floating gate transistor having a drain, a source coupled to the drain of the first select transistor, a first floating gate channel region formed between its drain and source, and a common floating gate overlying the floating gate channel region, wherein the floating gate channel region has a first channel width; a second select transistor including a select gate, source/drain formed in the ion well, and a channel region formed between its source and drain, wherein the source of the second select transistor is coupled to the source line; and a second floating gate transistor having a drain, a source coupled to the drain of the second select transistor, a second floating gate channel region formed between its drain and source, and the common floating gate overlying the second floating gate channel region. The second floating gate channel region has a second channel width that is not equal to the first channel width.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to an erasable programmable non-volatile memory cell, which is capable of being programmed at a relatively faster programming speed. According to this invention, the current consumption for programming one cell is reduced. Preferred embodiments in accordance with this invention will now be discussed with reference to FIG. 1 to FIG. 9. It shall be appreciated that, in some of the figures or tables demonstrated in the specification, the abbreviation "PGM" refers to "program" or "programming".

Figure 1:
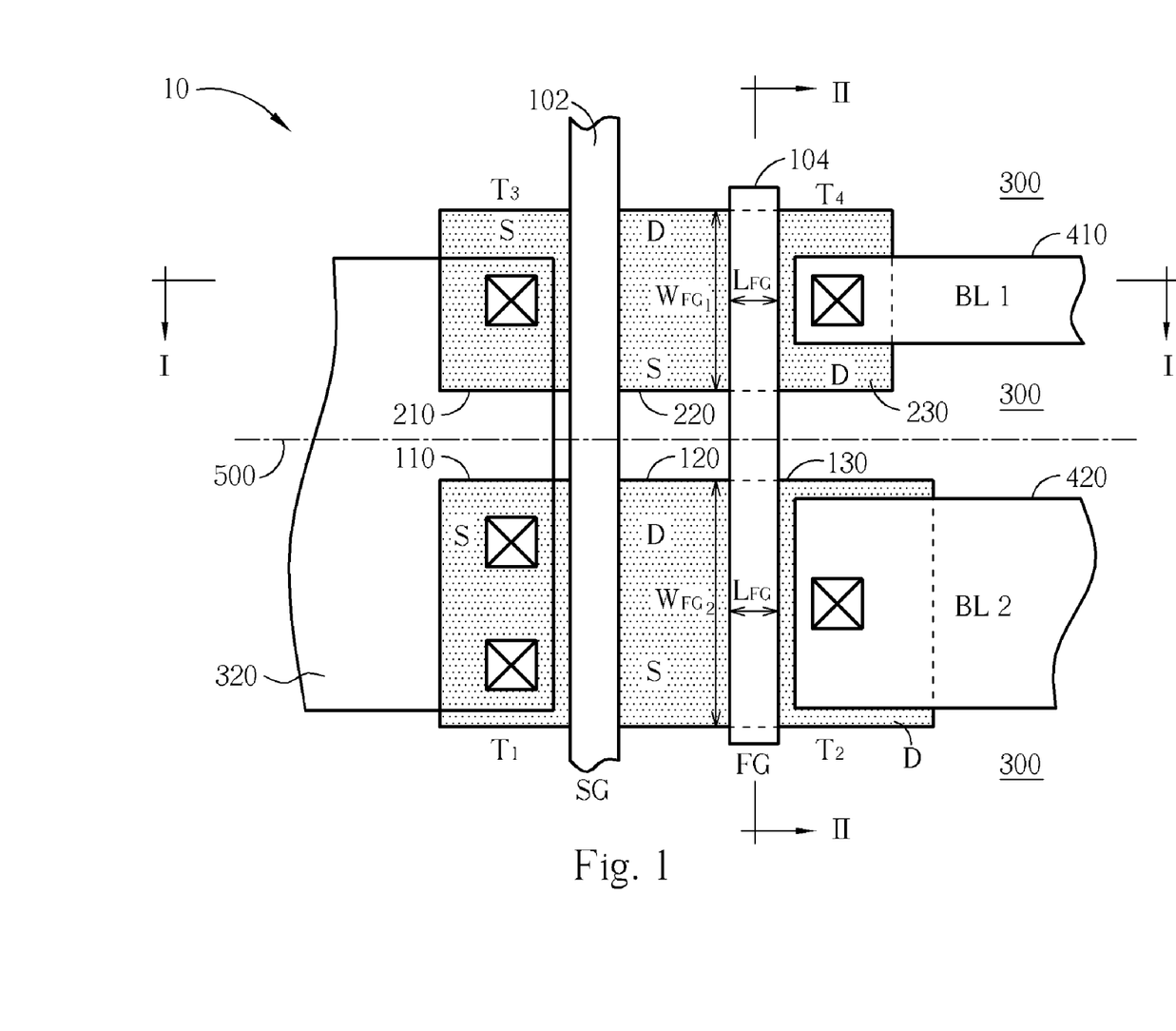
FIG. 1 is an enlarged top view schematically showing 4-T cell unit layout of a non-volatile memory device in accordance with one preferred embodiment of the present invention.
Figure 2:
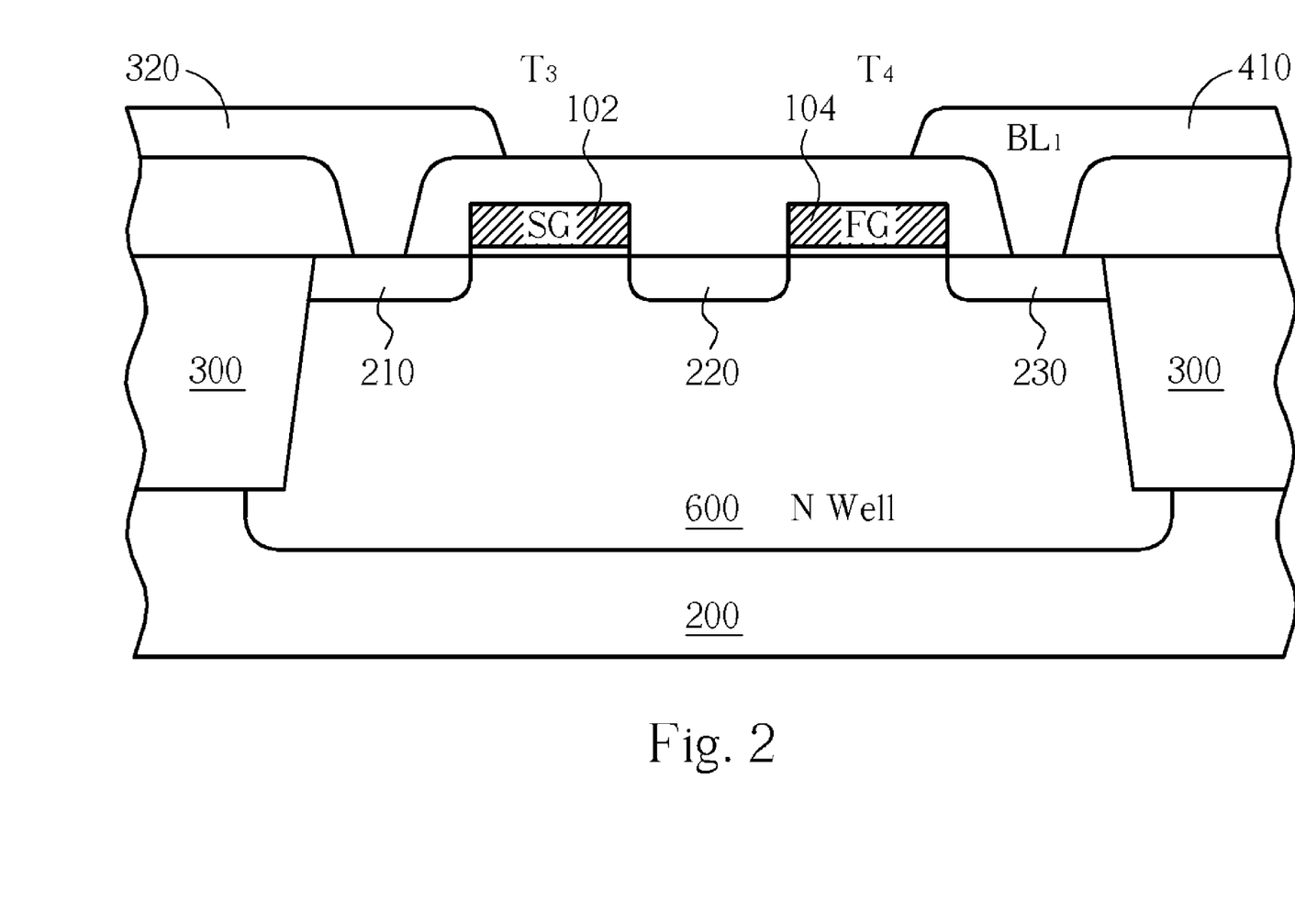
FIG. 2 is a schematic cross-sectional diagram illustrating the cell unit taken along line I—I.
Figure 3:
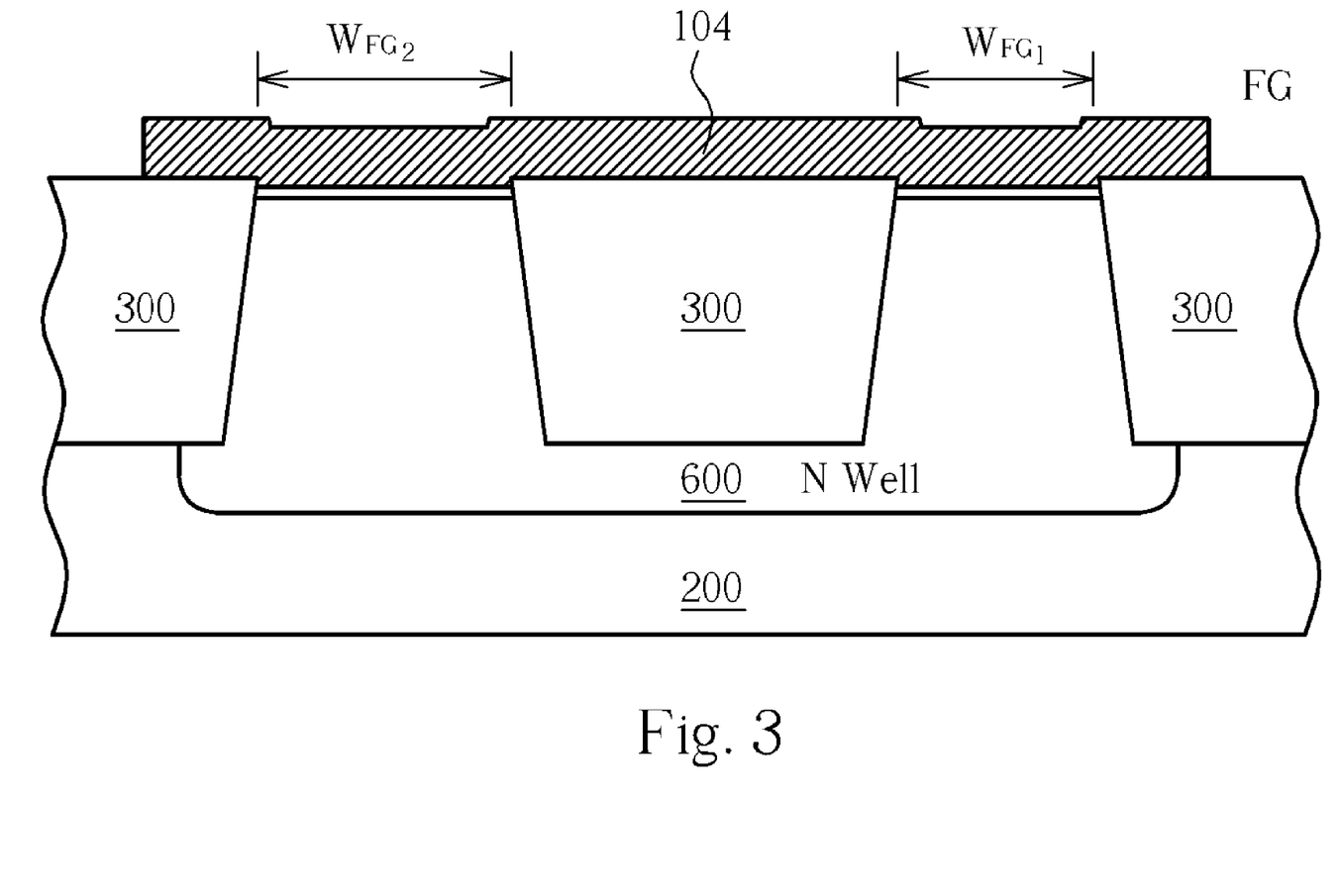
FIG. 3 is a schematic cross-sectional diagram illustrating the cell unit taken along line II—II.

Please refer to FIG. 1 to FIG. 3, wherein FIG. 1 is an enlarged top view schematically showing 4-T (four-transistor) cell unit layout of an non-volatile memory device in accordance with one preferred embodiment of the present invention; FIG. 2 is a schematic cross-sectional diagram illustrating the cell unit 10 taken along line I—I; FIG. 3 is a schematic cross-sectional diagram illustrating the cell unit 10 taken along line II—II. As shown in FIG. 1, the single-poly non-volatile memory cell 10 comprises a first select transistor ($T_1$), a first floating gate transistor ($T_2$) that is serially connected to the first select transistor, a second select transistor ($T_3$), and a second floating gate transistor ($T_4$) that is serially connected to the second select transistor. The four transistors $T_1$, $T_2$, $T_3$, and $T_4$ are fabricated by CMOS compatible process on a common N-type well 600 (FIG. 2) of a semiconductor 200. With insulation structures such as shallow trench isolation (STI) 300, the first select transistor $T_1$ is isolated from the second select transistor $T_3$, and the first floating gate transistor $T_2$ is isolated from the second floating gate transistor $T_4$.

The first select transistor $T_1$ comprises word line or select gate (SG) 102, a P-type source region 110 formed within the N-type well 600 at one side of the select gate SG 102, and a P-type drain region 120 formed within the aforesaid N-type well at the other side of the select gate SG 102. A select gate channel is defined between the source region 110 and the drain region 120. Via the P-type drain region 120, the first floating gate transistor $T_2$ is serially connected to the first select transistor $T_1$. That is, the P-type drain region 120 of the first select transistor $T_1$ also acts as a source region of the first floating gate transistor $T_2$, and thus commonly shared by $T_1$ and $T_2$. The commonly shared P-type source/drain region 120 is floating. The first floating gate transistor $T_2$ further comprises floating gate (FG) 104 and a P-type drain region 130 disposed at one side of the floating gate (FG) 104 opposite to the source/drain region 120.

The second select transistor $T_3$ comprises select gate (SG) 102, a P-type source region 210 formed within the aforesaid N-type well at one side of the select gate SG 102, and a P-type drain region 220 formed within the aforesaid N-type well at the other side of the select gate SG 102. Likewise, a channel region is defined under the select gate between the source region 210 and the drain region 220. Via the P-type drain region 220, the second floating gate transistor $T_4$ is serially connected to the second select transistor $T_3$. The P-type drain region 220 of the second select transistor $T_3$ also acts as a source region of the second floating gate transistor $T_4$ and is commonly shared by $T_3$ and $T_4$. The commonly shared P-type source/drain region 220 is floating. The second floating gate transistor $T_4$ further comprises floating gate 104 extended from $T_2$ and a P-type drain region 230 disposed at one side of the floating gate 104 opposite to the source/drain region 220.

Although the structure of the serially connected $T_1/T_2$ and the structure of the serially connected $T_3/T_4$ are somewhat similar, they are not definitely a mirror structure with respect to reference line (dash line) 500 in this embodiment. As can be seen in FIG. 1 and FIG. 3, preferably, the floating gate channel width ($W_{FG2}$) of the first floating gate transistor $T_2$ is larger than the floating gate channel width ($W_{FG1}$) of the second floating gate transistor $T_4$. The floating gate channel length is denoted as $L_{FG}$. The floating gate channel length of the first floating gate transistor $T_2$ is substantially equal to the floating gate channel length of the second floating gate transistor $T_4$. The width of the elongated floating gate 104 is substantially a constant through its longitudinal length according to this preferred embodiment.

The P-type source region 110 of the first select transistor $T_1$ and the P-type source region 210 of the second select transistor $T_3$ are electrically connected to the same source line (SL) 320 and are biased to a source voltage $V_{SL}$. The P-type drain region 230 of the second floating gate transistor $T_4$ is electrically connected to first bit line $BL_1$, while the P-type drain region 130 of the first floating gate transistor $T_2$ is electrically connected to second bit line $BL_2$.

Figure 4:
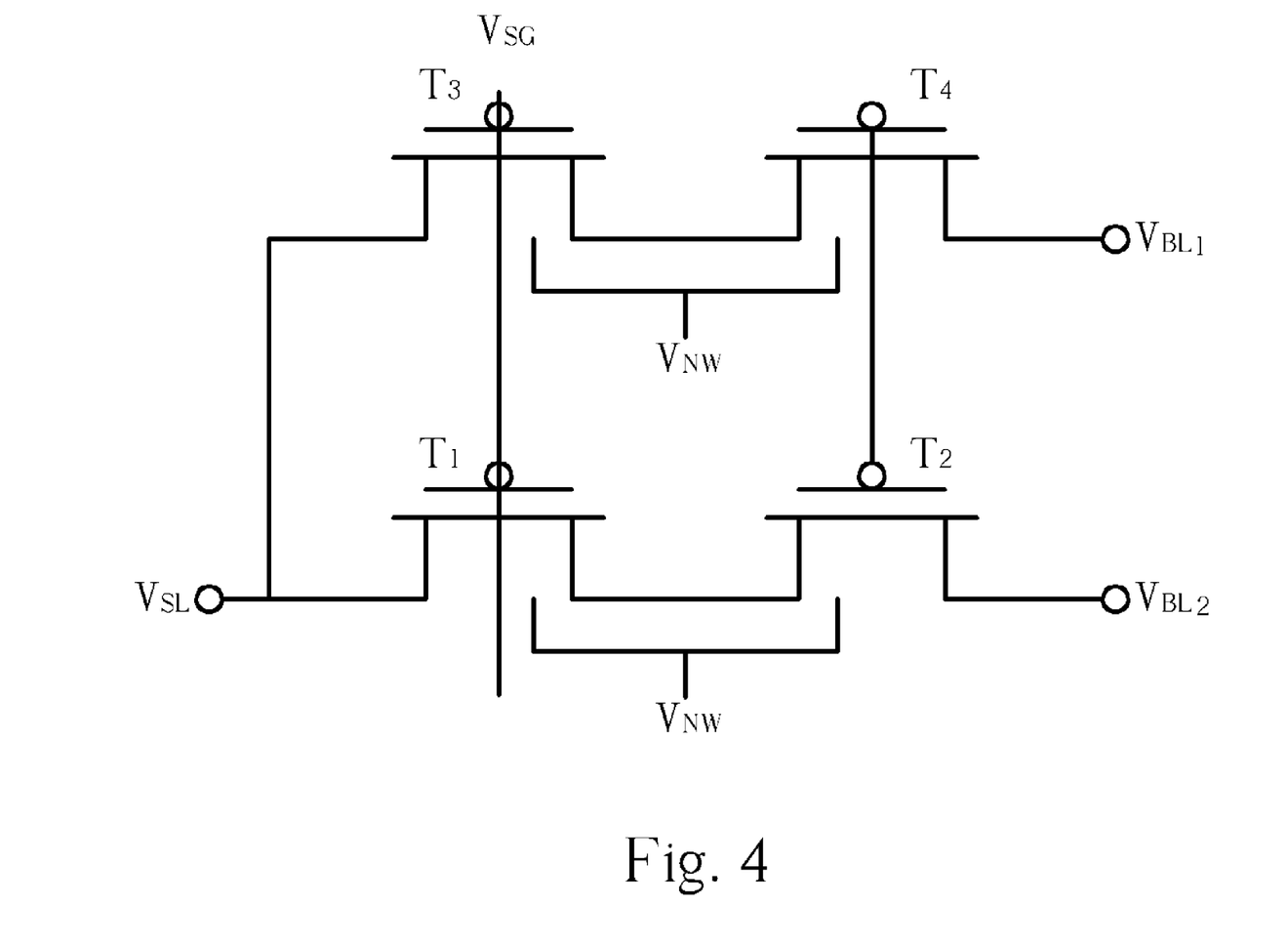
FIG. 4 is an equivalent circuit diagram of the 4-T cell unit of FIG. 1.

FIG. 4 is an equivalent circuit configuration of the 4-T cell unit as set forth in FIG. 1. As shown in FIG. 4 and briefly back to FIG. 1, the select gate 102 is biased to a select gate voltage $V_{SG}$, the N well 600 is biased to an N well voltage $V_{NW}$, the first bit line $BL_1$ is biased to a first bit line voltage $V_{BL1}$, the second bit line $BL_2$ is biased to a second bit line voltage $V_{BL2}$, and the source line is biased to source line voltage $V_{SL}$. The operation bias voltage conditions for programming and reading the 4-T cell unit are indicated in Table 1 as shown below.

TABLE 1

|     | $V_{BL1}$ | $V_{BL2}$ | $V_{SG}$ | $V_{SL}$ | $V_{NW}$ |
|-----|-----------|-----------|----------|----------|----------|
| PGM | $V_{PP1}$* | Floating | $V_{PP2}$ ($|V_{PP1}| \geq |V_{PP2}|$) | $V_{SS}$ | $V_{SS}$ |
| READ | Floating | $V_{READ}$ | $V_{READ}$ | $V_{SS}$ | $V_{SS}$ |

*$V_{PP1}$ is a negative voltage if $T_3$ is a PMOS transistor, and is positive voltage if $T_3$ is an NMOS transistor. $V_{PP2}$ is a negative voltage. All biasing voltages are relative biasing voltages.

In accordance with one preferred embodiment of the present invention, the 4-T cell unit 10 of the non-volatile memory device is programmed through the first bit line $BL_1$ 410, while the READ operation is carried out through the second bit line $BL_2$ 420. For example, to program the 4-T cell unit 10, $V_{BL1}$ voltage (=$V_{PP1}$) ranging between -3V and -10V is applied to the first bit line $BL_1$ 410, $V_{SG}$ voltage (=$V_{PP2}$) ranging between -1V and -7 preferably -6V, is applied to the select gate 102, $V_{BL2}$=Floating, and $V_{SL}$=$V_{NW}$=$V_{SS}$=0V. Under these bias voltage conditions, the second select transistor $T_3$ is turned on, and hot carriers (hot electrons in this case) produced at the nearly breakdown junction between the drain 230 and the N well 600 immediately inject into the floating gate 104 that has a negative coupled voltage $V_{FG}$ (channel hot hole induced hot electron mechanism). During programming operation, $V_{SL}$, $V_{BL1}$, $V_{NW}$, and the capacitor of $T_2$ (between the floating gate 104 and the N well 600) contribute to the coupled voltage $V_{FG}$. It is noted that during the programming operation the coupled voltage $V_{FG}$ is more positive than $V_{BL1}$.

As indicated in Table 1, to read the 4-T cell unit 10, $V_{BL1}$ is floating. $V_{BL2}$ (=$V_{READ}$) of about -1.5V is applied to the second bit line $BL_2$ 420. $V_{SG}$ voltage (=$V_{READ}$) of about -1.5V is applied to the select gate 102, and $V_{SL}$=$V_{NW}$=$V_{SS}$=0V. According to another preferred embodiment, $V_{BL1}$ may be equal to $V_{READ}$ during READ operation. In such case, to read the 4-T cell unit 10, $V_{BL1}$ (=$V_{READ}$) of about -1.5V is applied to the first bit line $BL_1$ 410. $V_{BL2}$ (=$V_{READ}$) of about -1.5V is applied to the second bit line $BL_2$ 420. $V_{SG}$ voltage (=$V_{READ}$) of about -1.5V is applied to the select gate 102, and $V_{SL}$=$V_{NW}$=$V_{SS}$=0V.

Figure 5:
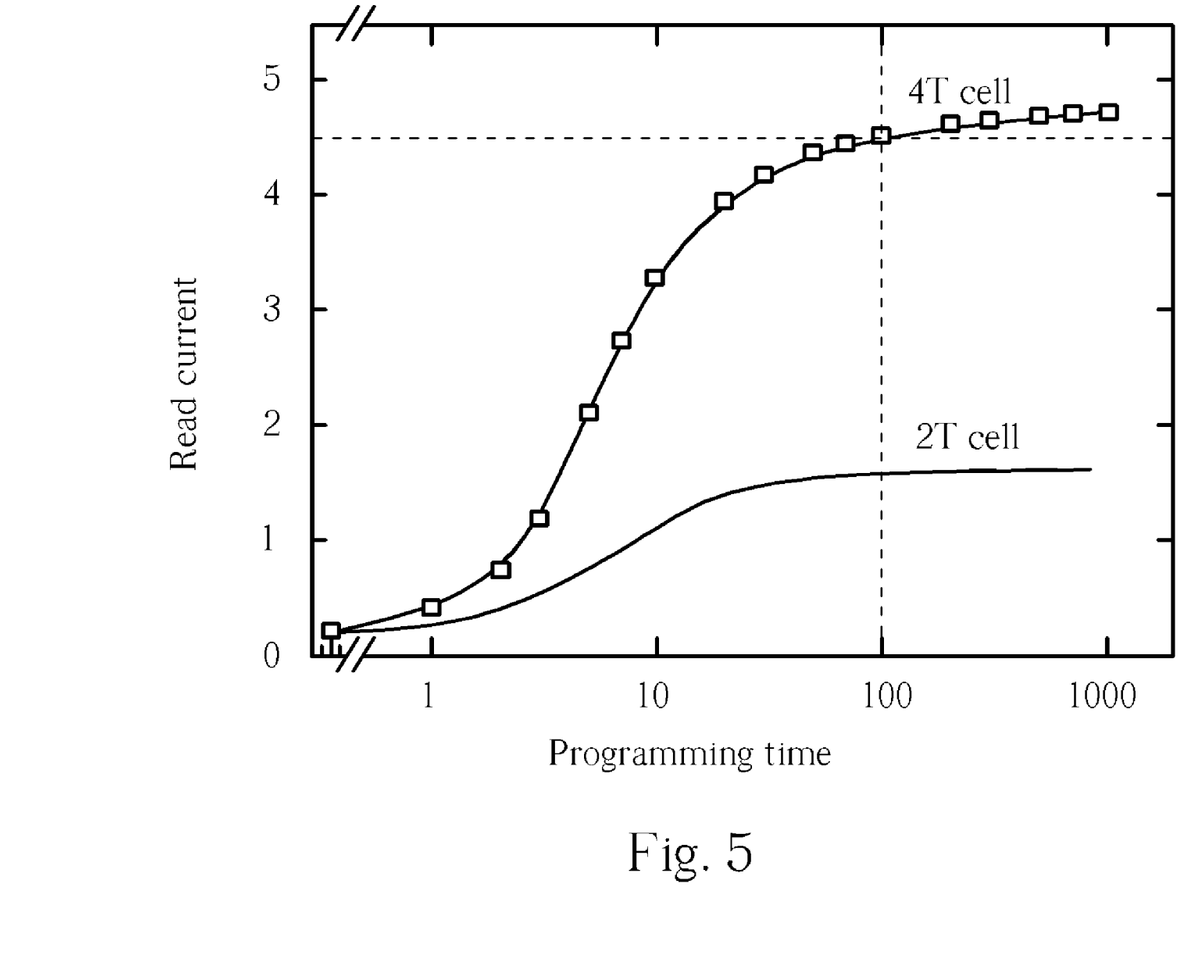
FIG. 5 is a graph demonstrating the programming performance of the 4-T cell unit of FIG. 1.

FIG. 5 is a graph demonstrating the programming performance of the 4-T cell unit of FIG. 1 compared with the 2-T cell structure disclosed in the commonly owned U.S. Pat. No. 6,678,190. The 4-T cell unit 10 of FIG. 1 is programmed for various periods of programming time (approximately from $10^{-6}$ seconds to $10^{-3}$ seconds) under the following bias voltage conditions: $V_{SG}$=-1.6V, $V_{BL1}$=-6V, $V_{BL2}$=Floated, and $V_{SL}$=$V_{NW}$=0V. The 4-T cell unit 10 of FIG. 1 is read under bias voltage conditions including: $V_{SG}$=$V_{BL2}$=-1.5V, $V_{BL1}$=Floated, and $V_{SL}$=$V_{NW}$=0V. The 2-T cell is programmed and read under similar conditions, except for the floated terminal. The read current of the 4-T cell unit is up to about 45 µA compared to 15 µA of the 2-T cell (for the same programming time period of about 100 µs).

Figure 6:
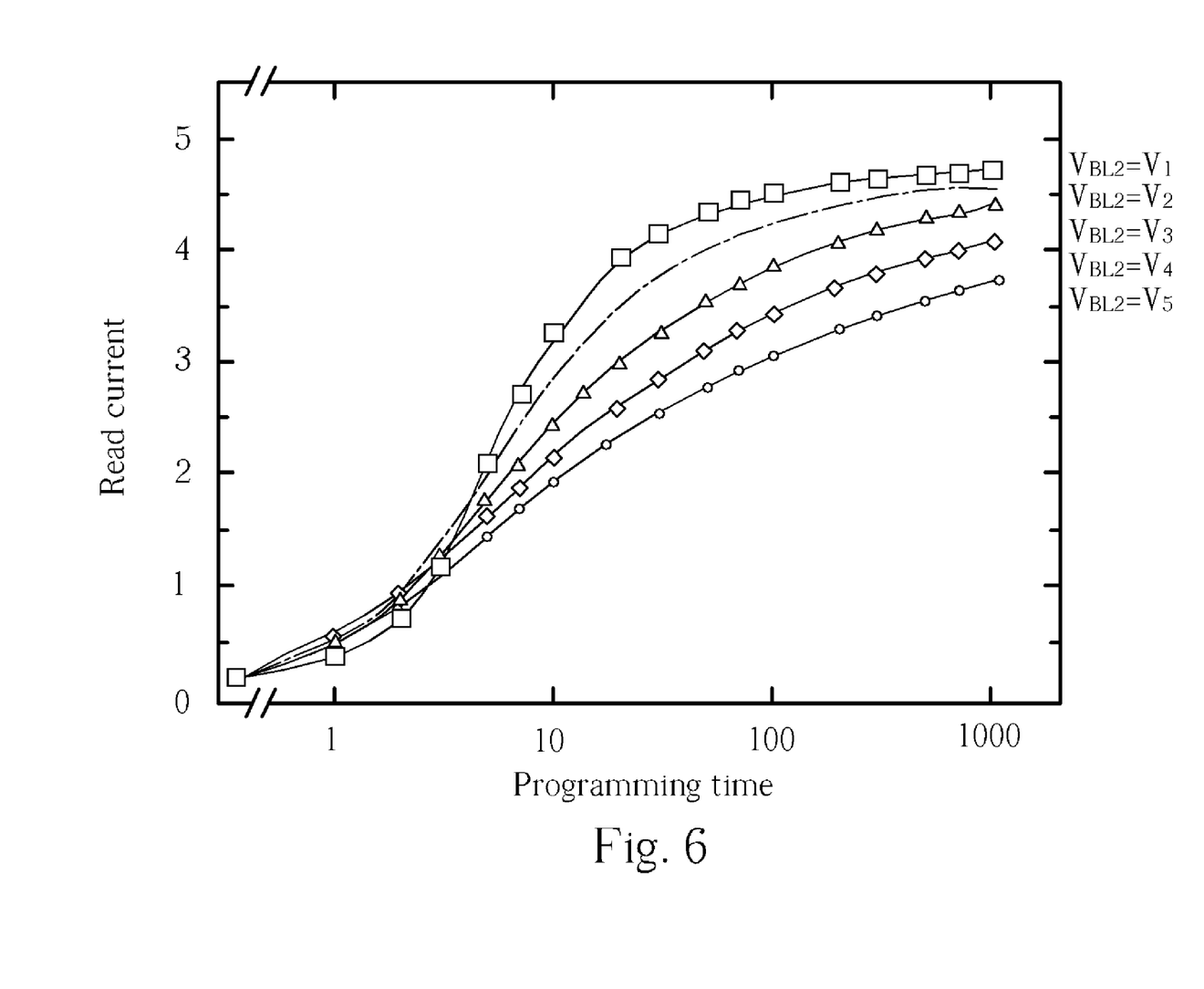
FIG. 6 is a graph showing the effect of $V_{BL2}$ on the programming speed.

FIG. 6 is a graph showing the coupling effect of $V_{BL2}$ on the programming speed of the 4-T cell unit of FIG. 1. To assess the effect of $V_{BL2}$ on the programming speed, the 4-T cell unit 10 of FIG. 1 is programmed for various periods of programming time (approximately from $10^{-6}$ seconds to $10^{-3}$ seconds) under the following bias voltage conditions: $V_{SG}$=-1.6V, $V_{BL1}$=-6V, $V_{SL}$=$V_{NW}$=0V, and $V_{BL2}$ sweeps from Floating to -2V(at an interval of 0.5V). The read current of the programmed 4-T cell unit 10 of FIG. 1 is measured under the following bias voltage conditions: $V_{SG}$=$V_{BL2}$=-1.5V, $V_{BL1}$=Floating, and $V_{SL}$=$V_{NW}$=0V. As can be seen in this plot, the programming speed is enhanced as $V_{BL2}$ increases every 0.5V (approximately 3-times faster every increase of 0.5V).

Figure 7:
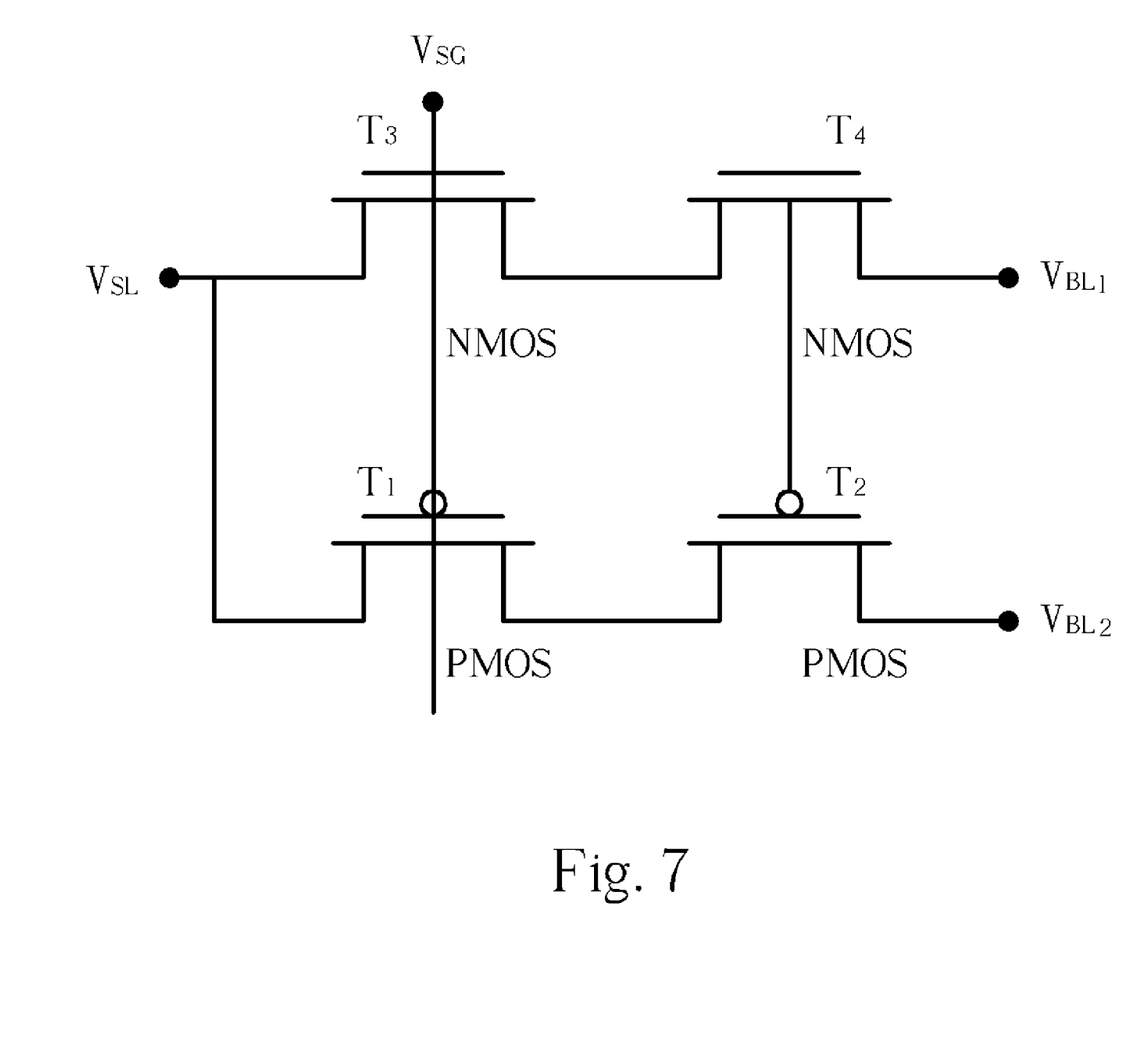
FIG. 7 to FIG. 9 are circuit diagrams in accordance with other preferred embodiments of this invention.
Figure 8:
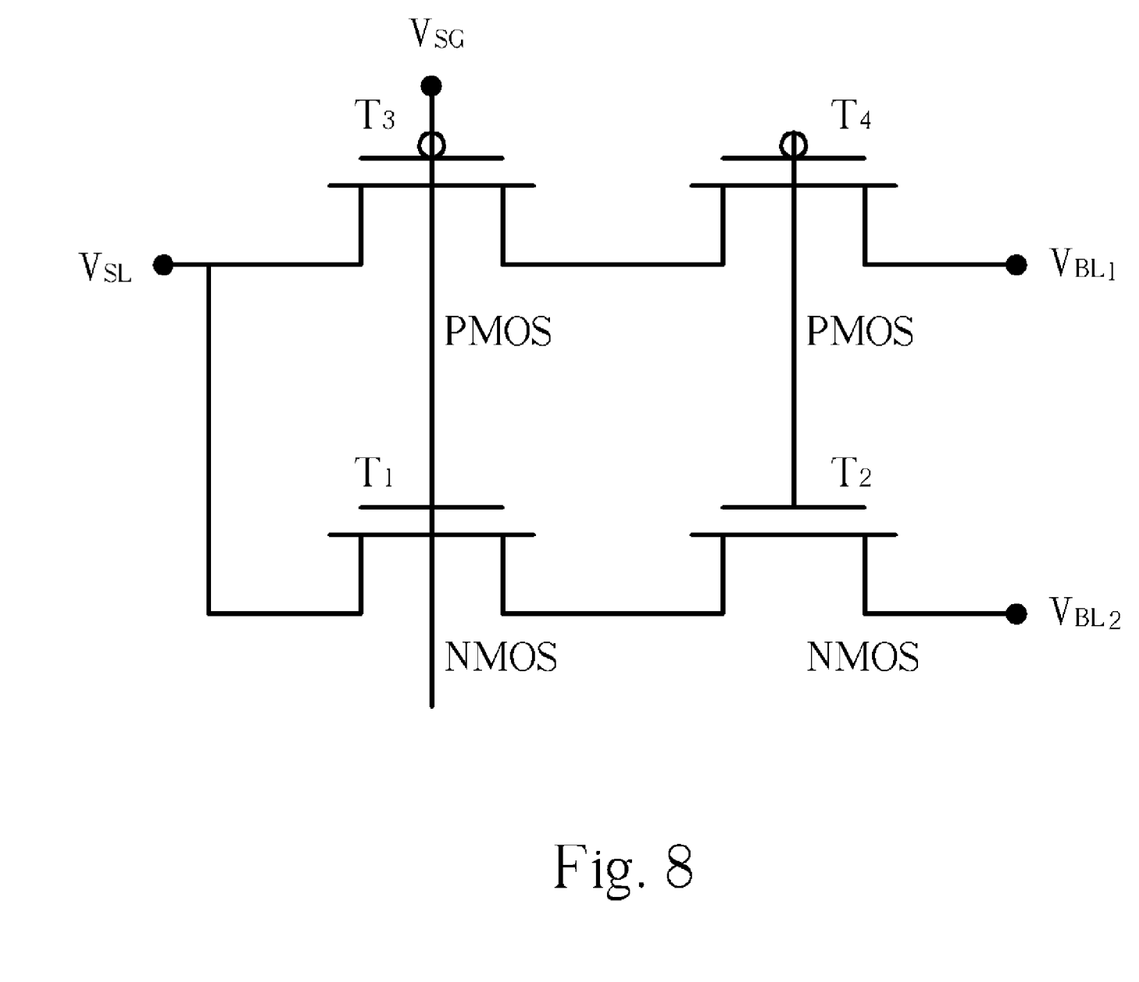
Figure 9:
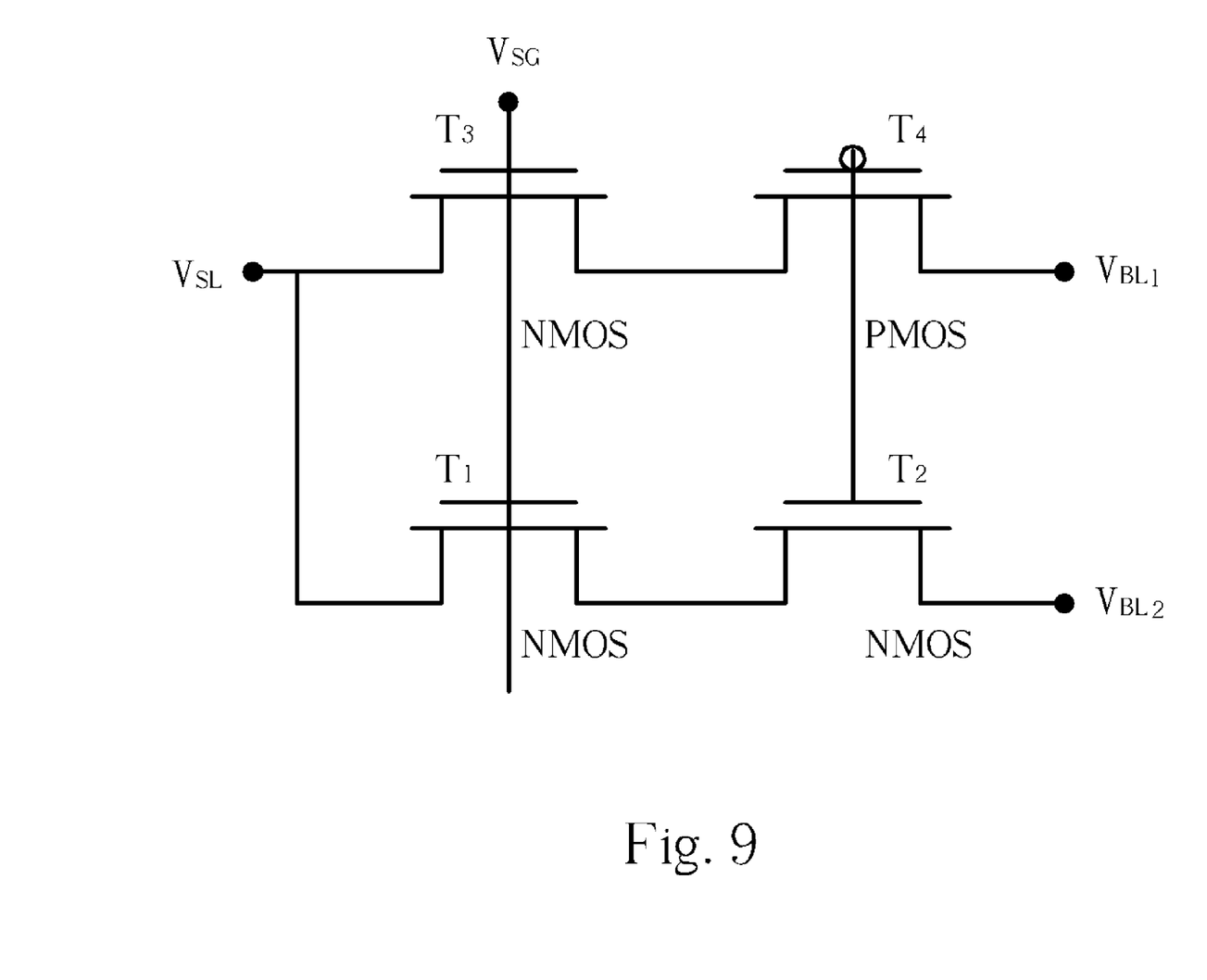

FIG. 7 to FIG. 9 are schematic equivalent circuit diagrams in accordance with other preferred embodiments of this invention. As shown in FIG. 7, $T_3$ is replaced with an NMOS transistor. $T_1$, $T_2$, and $T_4$ are PMOS transistors. As shown in FIG. 8, $T_1$ and $T_2$ are NMOS transistors, and $T_3$ and $T_4$ are PMOS transistors. As shown in FIG. 9, $T_1$, $T_2$, and $T_3$ are NMOS transistors, and $T_4$ is a PMOS transistor. In another embodiment, select transistors $T_1$ and $T_3$ may be merged together to become one single select transistor, thereby providing a 3-T memory cell configuration. It is noted that in a 3-T memory cell configuration, the drain of the single select transistor is disconnected with the floating gate transistor $T_2$.

To sum up, the 4-T cell has several advantages over the 2-T cell and other prior arts. The 4-T cell of this invention has much lower current consumption while programming (~10% of the 2T OTP). The programming speed of the 4-T cell is faster (more than 1 order). A larger read current is obtained and still no program disturbance.

Those skilled in the art will readily observe that numerous modifications and alterations of the device and method may be made while retaining the teachings of the invention. For example, the four transistors of the 4-T cell unit of the present invention may be four NMOS transistors. Accordingly, the above disclosure should be construed as limited only by the metes and bounds of the appended claims.

What is claimed is:

1. An erasable programmable non-volatile memory cell, comprising:
    a first select transistor including a select gate, source/drain, and a first channel region formed between its source and drain, wherein a source line is electrically connected to its source;
    a first floating gate transistor having a drain, a source coupled to the drain of the first select transistor, a second channel region formed between its drain and source, and a floating gate overlying the second channel region;
    a second select transistor including the said select gate, source/drain, and a third channel region formed between its source and drain, wherein the source of the second select transistor is coupled to the source line; and
    a second floating gate transistor having a drain, a source coupled to the drain of the is second select transistor, a fourth channel region formed between its drain and source, and said floating gate overlying the fourth channel region.

2. The erasable programmable non-volatile memory cell according to claim 1 wherein the erasable programmable non-volatile memory cell is formed in an ion well.

3. The erasable programmable non-volatile memory cell according to claim 2 wherein the ion well is N type, the second floating gate transistor is a PMOS transistor.

4. The erasable programmable non-volatile memory cell according to claim 1 wherein the first select transistor, the second select transistor, and the first floating gate transistor are PMOS transistors.

5. The erasable programmable non-volatile memory cell according to claim 1 wherein the second select transistor and the second floating gate transistor are PMOS transistors, while the first select transistor and the first floating gate transistor are NMOS transistors.

6. The erasable programmable non-volatile memory cell according to claim 1 wherein the second floating gate transistor is a PMOS transistor, while the first select transistor, the second select transistor and the first floating gate transistor are NMOS transistors.

7. The erasable programmable non-volatile memory cell according to claim 1 wherein the first floating gate transistor, the second floating gate transistor, and the first select transistor arc PMOS transistors, while the second select transistor is an NMOS transistor.

8. The erasable programmable non-volatile memory cell according to claim 1 wherein the cell is formed in an N type ion well, the first select gate transistor, the first floating gate transistor, second select gate transistor and second floating gate transistor are PMOS transistors.

9. The erasable programmable non-volatile memory cell according to claim 1 wherein the drain of the second floating gate transistor is electrically connected to a first bit line, while the drain of the first floating gate transistor is electrically connected to a second bit line.

10. The erasable programmable non-volatile memory cell according to claim 2 wherein when programming or reading the EPROM cell, the ion well is coupled to $V_{SS}$.

11. The erasable programmable non-volatile memory cell according to claim 1 wherein when programming or reading the EPROM cell, the source line is coupled to $V_{SS}$.

12. The erasable programmable non-volatile memory cell according to claim 1 wherein when programming or reading the EPROM cell, the select gates are coupled to a select gate voltage to turn on the channel thereof.

13. The erasable programmable non-volatile memory cell according to claim 9 wherein when programming the EPROM cell, a first lit line voltage ($V_{BL1}$) is applied to the first bit line while the second bit line is floating, and such assignment of operating voltages are interchangeable between the first bit line and the second bit line.

14. The erasable programmable non-volatile memory cell according to claim 13 wherein the first bit line voltage is negative when applying to a PMOS transistor, and is positive when applying to an NMOS transistor.

15. The erasable programmable non-volatile memory cell according to claim 13 wherein the first bit line voltage's absolute value ranges between 3V and 10V.

16. A non-volatile memory cell comprising a first transistor and a second transistor sharing one floating gate strip, wherein source/drain of the first and second transistors are connected out to independent four terminals, and wherein when programming the non-volatile memory cell, drain of the first transistor is biased to VPP, source of the first transistor is biased to VSS1, drain of the second transistor is floated, and source of the second transistor is biased to VSS2; wherein the four terminals include a source terminal that is serially connected to a switch device for selection or the non-volatile memory cell.

17. The non-volatile memory cell according to claim 16 wherein the said switch device is a metal-oxide-semiconductor (MOS) transistor.

18. The non-volatile memory cell according to claim 16 wherein the switch device comprises two MOS transistors sharing a gate, wherein a first MOS transistor of the switch device has a drain that is connected to the source of the first transistor of the non-volatile memory cell, while a second MOS transistor of the switch device has a drain that is connected to the source of the second transistor of the non-volatile memory cell.

19. The non-volatile memory cell according to claim 16 wherein the transistors are MOS transistors.

* * * * *